United States Patent [19]

Canize et al.

[11] Patent Number: 5,612,164
[45] Date of Patent: Mar. 18, 1997

[54] POSITIVE PHOTORESIST COMPOSITION COMPRISING A MIXED ESTER OF TRISHYDROXYPHENYL ETHANE AND A MIXED ESTER OF TRIHYDROXYBENZOPHENONE

[75] Inventors: Anthony Canize, Flemington, N.J.; Stanley A. Ficner, Bethlehem, Pa.; Ping-Hung Lu, Bridgewater, N.J.; Walter Spiess, Muenster, Germany

[73] Assignee: Hoechst Celanese Corporation, Somerville, N.J.

[21] Appl. No.: 385,857

[22] Filed: Feb. 9, 1995

[51] Int. Cl.$^6$ ............................................. G03F 7/023
[52] U.S. Cl. ........................... 430/165; 430/191; 430/192; 430/193; 534/557
[58] Field of Search .................................. 430/165, 191, 430/192, 193; 534/557

[56] References Cited

U.S. PATENT DOCUMENTS

| | | | |
|---|---|---|---|
| 4,818,658 | 4/1989 | Martin et al. | 430/192 |
| 5,290,658 | 3/1994 | Uenishi et al. | 430/192 |
| 5,362,599 | 11/1994 | Knors et al. | 430/192 |

*Primary Examiner*—John S. Chu
*Attorney, Agent, or Firm*—Andrew F. Sayko, Jr.

[57] ABSTRACT

A photosensitizer comprising a trishydroxyphenylethane 80/20 to 50/50 2,1,5-/2,1,4-diazonaphthoquinone sulfonate, and a trishydroxybenzophenone 0/100 to 20/80 2,1,5-/2,1,4-diazonaphthoquinone sulfate, and a photoresist composition containing such photosensitizer, the photosensitizer being present in the photoresist composition in an amount sufficient to uniformly photosensitize the photoresist composition; and a water insoluble, aqueous alkali soluble novolak resin, the novolak resin being present in the photoresist composition in an amount sufficient to form a substantially uniform photoresist composition.

13 Claims, No Drawings

POSITIVE PHOTORESIST COMPOSITION COMPRISING A MIXED ESTER OF TRISHYDROXYPHENYL ETHANE AND A MIXED ESTER OF TRIHYDROXYBENZOPHENONE

FIELD OF THE INVENTION

The present invention relates to novel photoactive compounds and to positive photoresist compositions containing such a photoactive compound especially sensitive in the i-line range of the spectrum (365 nm), based on a diazonapthoquinone sensitizer, a novolak resin and a suitable photoresist solvent.

DESCRIPTION OF THE PRIOR ART

Photoresists are materials which change their solubility in a developer solution after the photoresist has been exposed to actinic radiation, such as to 365 nanometer (nm) radiation. Photoresist compositions comprise a photoactive compound (PAC) (sometimes called a photosensitizer), a film forming polymeric resin and a solvent. There are other types of compositions possible, such as a photosensitizer composition dissolved in an appropriate solvent, such as propylene glycol methyl ether acetate (PGMEA). The photoresist composition is applied to a substrate which is to be patterned and the solvent is then substantially removed, as with heat, leaving the photoresist as a thin film covering the substrate. As a result of the exposure to radiation of the photoresist, a different solubility rate results between the exposed and unexposed (masked over) portions of the photoresist film which yields a surface relief pattern after development. Those photoresists which become more soluble in a developer solution in the exposed regions are referred to as "positive" photoresists. Those which become less soluble in the exposed regions are referred to as "negative" photoresists. The present invention deals with a class of those compounds suitable for use in positive photoresist compositions.

Positive photoresists may comprise an aqueous alkali soluble resin, such as a novolak resin or a poly(p-hydroxystyrene), and a photosensitizer. The resin and photosensitizer are applied, such as by spin coating, spray coating, or other suitable means, from an organic solvent or solvent mixture onto a substrate, such as a silicon wafer or a chrome-plated glass plate. The developer normally used to process the positive photoresists are aqueous alkaline solutions, such as sodium metasilicate, potassium hydroxide, tetramethyl ammonium hydroxide and ammonium hydroxide. The developer removes the areas of the coated photoresist film that have been exposed to light or other form of irradiation, so as to produce a relief pattern in the photoresist film.

The application of a photosensitive film to various substrates is an essential step in the fabrication of integrated circuits. The substrates are generally silicon wafers which may have a thin oxide coating or other coating such as silicon nitride or aluminum. The photosensitive film is used to pattern the substrate in a series of steps including exposure (through a mask pattern), development to yield a relief pattern in the photoresist layer, and a substrate etch step to transfer that pattern into the substrate material. It is essential that the mask pattern be accurately reproduced in the substrate etch pattern. To achieve this high degree of accuracy, the mask pattern must be well resolved by the photoresist layer. Conventional photoresists may employ a novolak resin resins as the water insoluble, the alkali soluble, film forming polymer.

BACKGROUND OF THE INVENTION

The present invention relates to radiation sensitive compositions (photosensitizers) and to positive working photoresist compo-sitions containing such photosensitizers, and particularly to photoresist compositions containing a novolak resin, such as those disclosed in copending patent application U.S. Ser. No. 07/952,451 filed on Sept. 28, 1992, together with a blend of photosensitizers, which are: a trishydroxyphenylethane 2,1,5-/2,1,4-diazonapthoquinone sulfonate, and a trihydroxybenzophenone 2,1,4-diazonaphtoquinone sulfate.

It is known to the skilled artisan to produce positive photoresist compositions, such as those described in U.S. Pat. Nos. 3,666,473; 4,115,128 and 4,173,470. These include water insoluble, aqueous alkali-soluble phenolformaldehyde novolak resin resins together with light-sensitive materials, usually a substituted naphthoquinone diazide compound. The resins and photosensitizers are dissolved in an organic solvent or mixture of solvents and are applied as a thin film or coating to a substrate suitable for the particular application desired.

The novolak resin component of these photoresist formulations is soluble in aqueous alkaline solutions, but the photosensitizer is not soluble prior to exposure. Upon imagewise exposure of portions of the coated substrate to actinic radiation, the photosensitizer is rendered alkali soluble and the exposed areas of the coating become more soluble than the unexposed areas. This difference in solubility rates causes the exposed areas of the photoresist coating to be dissolved when the substrate is immersed in or otherwise contacted with an alkaline developing solution, while the unexposed areas are largely unaffected, thus producing a positive relief pattern on the substrate. The exposed and developed substrate is usually thereafter subjected to an etching process. The photoresist coating protects the coated areas of the substrate from the etchant and the etchant is only able to etch the uncoated areas of the substrate, which correspond to the areas that were exposed to actinic radiation. Thus, an etched pattern can be created on the substrate which corresponds to the pattern of the mask, stencil, template, etc., that was used to created selective exposure patterns on the coated substrate prior to development. The relief pattern of photoresist on a substrate produced by this method is useful for various applications including the manufacture of miniaturized integrated circuits.

The characteristics of the photoresist compositions, which are important in commercial practice, include its photospeed, contrast, resolution (edge acuity), thermal stability of the image during processing, processing latitude, line width control, clean development and unexposed film loss.

Photoresist contrast is the slope of the linear portion of the curve resulting from the plot of the log of exposure energy vs. normalized film thickness remaining under fixed development conditions. In use, development of an exposed photoresist coated substrate is continued until the coating on the exposed area is substantially completely dissolved away. Resolution refers to the capability of a photoresist system to reproduce the smallest equally spaced line pairs and intervening spaces of a mask which is utilized during exposure with a high degree of image edge acuity in the developed exposed spaces. In the manufacture of miniaturized electronic components, a photoresist is required to provide a high degree of resolution for very small line and space widths usually on the order of one micron (micrometer) or less. This capability to reproduce very small dimensions, is extremely important in the production of large scale integrated circuits on silicon chips and similar components. Circuit density on such a chip can only be increased, assuming photolithography techniques are utilized, by increasing the resolution capabilities of the photoresist. Although negative photoresists, wherein the exposed areas of photoresist coating become insoluble and the unexposed areas are dissolved away by the developer, have been extensively used for this purpose by the semiconductor industry, positive photoresists have inherently higher resolution and are utilized as replacements for the negative photoresists.

In photoresist technology, it has normally been desired to increase photoresist contrast. High contrast positive working photoresists produce developed images which exhibit high edge acuity, when exposure is performed on typical equipment such as steppers and projection aligners. In most lithographic semiconductor applications, the high edge acuity of developed images is of great importance since it allows for small variations of line width over the wafer's topography. Therefore, it permits good control of etching during anisotropic plasma-etching and is typically associated with good processing latitude.

SUMMARY OF THE INVENTION

The invention provides a photosensitizer and a positive photoresist composition which contains such photosensitizer, which photoresist has good photospeed, high contrast, good resolution, good thermal stability of the image during processing, wide processing latitude, good line width control, clean development and low unexposed film loss.

The photosensitizer comprises: from about 25% by weight to about 85% by weight of a trishydroxyphenylethane 80/20 to 50/50 preferably from about 60/40 to 70/30, 2,1,5-/2,1,4-diazonaphthoquinone sulfonate; and from about 15% by weight to about 75% by weight of a trihydroxybenzophenone 0/100 to 20/80 2,1,5-/2,1,4-diazonaphthoquinone sulfate.

The photoresist composition comprises an admixture of:
(a) a photosensitive component which comprises from about 25 to about 85 weight percent of a trishydroxyphenylethane 80/20 to 50/50, preferably from about 60/40 to about 70/30, 2,1,5-/2,1,4-diazonapthoquinone sulfonate, and from about 15 to about 75 weight percent of a trihydroxybenzophenone 0/100 to 20/80 2,1,5-/2,1,4-diazonaphthoquinone sulfate, the photosensitive component being present in the photoresist composition in an amount sufficient to uniformly photosensitize the photoresist composition;
(b) a water insoluble, aqueous alkali soluble, film forming novolak resin, the novolak resin being present in the photoresist composition in an amount sufficient to form a substantially uniform photoresist composition; and
(c) a suitable solvent, preferably PGMEA;

The invention further provides a photosensitive element which comprises the foregoing admixture coated and dried on a substrate.

The invention also provides a method for producing a photoresist image on a substrate, which comprises coating a substrate with a positive working photosensitive composition which composition contains in admixture:
(a) a photosensitive component which comprises from about 25 to about 85 weight percent of a trishydroxyphenylethane 80/20 to 50/50, preferably from about 60/40 to 70/30, 2,1,5-/2,1,4-diazonapthoquinone · sulfonate, and from about 15 to about 75 weight percent of a trihydroxybenzophenone 0/100 to 20/80 2,1,5-/2,1,4-sulfate, the photosensitive component being present in the photoresist composition in an amount sufficient to uniformly photosensitize the photoresist composition;
(b) a water insoluble, aqueous alkali soluble, film forming novolak resin; the novolak resin being present in the photoresist composition in an amount sufficient to form a substantially uniform photoresist composition; and
(c) a suitable solvent, such as PGMEA; and heat treating the coated substrate until substantially all of the solvent composition is removed; imagewise exposing the photosensitive composition to actinic radiation; and removing the imagewise exposed areas of the composition with an aqueous alkaline developer. Optionally one may perform a baking of the substrate either immediately before or after the removing step.

DETAILED DESCRIPTION OF THE PREFERRED EMBODIMENTS

In the production of the relief image of the present invention, one coats and dries the foregoing photoresist composition on a suitable substrate.

Novolak resin resins have been commonly used in the art of photoresist manufacture as exemplified by "Chemistry and Application of Phenolic Resins", Knop A. and Scheib, W.; Springer Verlag, New York, 1979 in Chapter 4. Similarly, o-quinone diazides are well known to the skilled artisan as demonstrated by "Light Sensitive System", Kosar J.; John Wiley & Sons, New York, 1965 in Chapter 7.4.

The particular photosensitizer of the present invention, which is also a component of the photoresist composition of the present invention, comprises from about 25 to about 85 weight percent of a trishydroxyphenylethane 80/20 to 50/50, preferably from about 60/40 to 70/30, 2,1,5-/2,1,4-diazonapthoquinone sulfonate; and from about 15 to about 75 weight percent of a trihydroxybenzophenone 0/100 to 20/80 2,1,5-/2,1,4-diazo-naphthoquinone sulfate. The photoresist composition also comprises a water insoluble, aqueous alkali soluble, film forming novolak resin; and a suitable solvent, such as PGMEA.

The photoresist composition is formed by blending the ingredients in a suitable solvent. In the preferred embodiment, the amount of novolak resin in the photoresist composition preferably ranges from 65% to about 99% and more preferably from about 70% to about 95%, based on the weight of the solid, i.e. non-solvent photoresist parts. In the preferred embodiment, the photo-sensitizer is present in the photoresist in an amount of from about 1% to about 35% or more preferably from about 5% to about 30%, based on the weight of the solid photoresist components. In manufacturing the photoresist composition, the novolak resin and photosensitizer are mixed with such solvents as acetone, chlorobenzene, propylene glycol mono-alkyl ether, propylene glycol alkyl ether acetates, ethyl lactate, butyl acetate, xylene, 2-heptanone, ethylene glycol monoethyl ether acetate, and most preferably, PGMEA or ethyl-3-ethoxypropionate (EEP).

Other optional ingredients such as colorants, dyes, antistriation agents, leveling agents, plasticizers, adhesion promoters, speed enhancers, solvents and such surfactants as nonionic surfactants may be added to the solution of novolak resin, photosensitizer and solvent before the solution is coated onto a substrate. Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of novolak resin and photosensitizer. The dye additives help provide increased resolution by inhibiting back scattering of light off the substrate.

Anti-striation agents may be used at up to a five percent weight level, based on the combined weight of novolak resin and photosensitizer. Plasticizers which may be used include, for example, phosphoric acid tri(beta-chloroethyl)-ester; stearic acid; dicamphor; polypropylene; acetal resins; phenoxy resins; and alkyl resins at one to ten percent weight levels, based on the combined weight of novolak resin and photosensitizer. The plasticizer additives improve the coating properties of the material and enable the application of a film that is smooth and of uniform thickness to the substrate. Adhesion promoters which may be used include, for example, beta-(3,4-epoxycyclohexyl)-ethyltrimethoxysilane; p-methyl-disilanemethyl methacrylate; vinyltrichlorosilane; and gamma-amino-propyl triethoxysilane up to a 4 percent weight level, based on the combined weight of novolak resin and photosensitizer. Development speed enhancers that may be used include, for example, picric acid, nicotinic acid or nitrocinnamic acid by a weight level of up to 20 percent, based on the combined weight of novolak resin and photosensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

The coating solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to 10% weight levels, based on the combined weight of novolak resin and photosensitizer.

The prepared photoresist solution, can be applied to a substrate by any conventional method used in the photoresist art, including dipping, spraying, whirling and spin coating. When spin coating, for example, the photoresist solution can be adjusted with respect to the percentage of solids content in order to provide coating of the desired thickness given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters. The substrate may have an adhesion promoted layer of a suitable composition such as one containing hexa-alkyl disilazane.

The photoresist composition solution is then coated onto the substrate, and the substrate is temperature treated at from about 80° C. to about 110° C., for from about 30 seconds to about 180 seconds on a hot plate or for from about 15 to about 40 minutes in a convection oven. This temperature treatment is selected in order to reduce the concentration of residual solvents in the photoresist while not causing substantial thermal degradation of the photosensitizer. In general one desires to minimize the concentration of solvents and thus this first temperature treatment is conducted until substantially all of the solvents have evaporated and a thin coating of photoresist composition, on the order of one micron in thickness, remains on the substrate. In a preferred embodiment the temperature is conducted at from about 85° C. to about 95° C. The treatment is conducted until the rate of change of solvent removal becomes relatively insignificant. The temperature and time selection depends on the photoresist properties desired by the user as well as equipment used and commercially desired coating times. The coating substrate can then be exposed to actinic radiation, especially ultraviolet radiation, at a wavelength of from about 300 nm to about 450 nm (preferably at about 365 nm), x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 150° C., more preferably from about 110° C. to about 150° C. The heating may be conducted for from about 10 seconds to about 30 minutes, more preferably from about 45 seconds to about 90 seconds on a hot plate or about 10 to about 30 minutes by convection oven.

The exposed photoresist-coated substrates are developed to remove the imagewise exposed, non-image areas by spray developing using an alkaline developing solution. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. A suitable developer is AZ Developer available commercially from the AZ Photoresist Products group of Hoechst Celanese Corporation, Somerville, N.J. After removal of the coated wafers from the developing solution, one may conduct an optional post-development heat treatment or bake in increase the coating's adhesion and chemical photoresistance to etching solutions and other substances. The post-development heat treatment can comprise the oven baking of the coating and substrate below the coating's softening point. The industrial applications, particularly in the manufacture of microcircuitry units on silicon/silicon dioxide-type substrates, the developed substrates may be treated with a buffered, hydrofluoric acid base etching solution. The photoresist compositions of the present invention are photoresistant to acid-base etching solutions and provide effective protection for the unexposed photoresist-coating areas of the substrate.

The following specific examples will provide detailed illustrations of the methods of producing and utilizing the compositions of the present invention. These examples are not intended to limit or restrict the scope of the invention in any way and should not be construed as providing conditions, parameters or values which must be utilized exclusively in order to practice the present invention.

EXAMPLE 1

Formulation
1) Trishydroxyphenylethane—a 70/30 2,1,5-/2,1,4-diazonapthoquinone sulfonate=4 grams
2) Trihydroxybenzophenone 2,1,4-diazonaphtoquinone sulfate=0 grams
3) water insoluble, aqueous alkali soluble, film forming novolak resin blend, prepared according to the procedure set forth in Example 1 of copending U.S. Pat. application Ser. No. 07/952,451 filed on Sept. 28, 1992. The first novolak resin components of the blend was produced by reacting 0.9 moles of 100% formaldehyde with 1.33 moles of a 6.3/3.0 mixture of m-cresol and 3,5-xylenol in 100 grams of dipropylene glycol methyl ether (DPGME) in the presence of 1.125 grams of maleic anhydride catalyst. The second component was produced by reacting 0.97 moles of 100% formaldehyde with 1.33 moles of 6.3/3.0 mixture of m-cresol and 3,5-xylenol in 100 grams of DPGME in the presence of 1.125 grams of maleic anhydride catalyst. The first component had a Relative Molecular weight (RMW) of 8.8 and a Dissolution Rate (DR) of 5.0 μm per minute. The second component had an RMW of 11.3 and a DR of 2.0 μm per minute. The two components were blended together at a ratio of first component/second component of 0.40/0.60. cresol mixture=21 grams 4) PGMEA=75 grams

EXAMPLE 2

Formulation
1) Trishydroxyphenylethane—a 70/30 2,1,5-/2,1,4-diazonapthoquinone sulfonate=0 grams
2) Trihydroxybenzophenone 2,1,4-diazonaphtoquinone sulfate=4 grams
3) The water insoluble, aqueous alkali soluble novolak resin blend of Example 1=21 grams
4) PGMEA=75 grams

EXAMPLE 3

Formulation
1) Trishydroxyphenylethane 70/30 2,1,5-/2,1,4-diazonapthoquinone sulfonate=3.23 grams
2) Trihydroxybenzophenone 2,1,4-diazonaphtoquinone sulfate=0.77 grams
3) The water insoluble, aqueous alkali soluble novolak resin blend of Example 1=21 grams
4) PGMEA=75 grams

EXAMPLE 4

Formulation
1) Trishydroxyphenylethane 70/30 2,1,5-/2,1,4-diazonapthoquinone sulfonate=1.23 grams
2) Trihydroxybenzophenone 2,1,4-diazonaphtoquinone sulfate=2.77 grams
3) The water insoluble, aqueous alkali soluble novolak resin blend of Example 1=21 grams
4) PGMEA=75 grams

EXAMPLE 5

Formulation
1) Trishydroxyphenylethane 70/30 2,1,5-/2,1,4-diazonapthoquinone sulfonate=2.45 grams
2) Trihydroxybenzophenone-2,1,4-diazonaphtoquinone sulfate=1.55 grams
3) The water insoluble, aqueous alkali soluble novolak resin blend of Example 1=21 grams
4) PGMEA=75 grams The photoresist solutions of Examples 1 through 5 were spin coated, using standard techniques, on to 4" silicon wafers at a constant speed to obtain layers of dried photoresist film having an initial thickness of about 1.0 μm, as measured by a Rudolf® Film Thickness Monitor. The wafers were baked at 110° C. for 1 minute and then exposed to 365 nanometer light. The wafers were then post exposure baked at 110° C. for 1 minute. The photoresists were developed for one minute at 21° C., using AZ® 300-MIF Developer (available from the AZ Photoresist Products Division of Hoechst Celanese Corporation).

Silicon wafers were processed using the five examples and previously listed conditions. Scanning electron micrographs were taken of 0.6 μm dense line and spaces. Criteria for evaluation were dose to print, resolution and depth of focus,

|  | Dose to print of 0.6 μm l/s mJ/cm² | Resolution (μm) | Exposure Latitude 0.6 μm l/s | Depth of Focus (0.6 μm l/s) |
|---|---|---|---|---|
| Example 1 | 111 | 0.38 | 34% | 1.8 |
| Example 2 | 26 | 0.50 | 27% | 1.6 |
| Example 3 | 80 | 0.40 | 35% | 1.8 |
| Example 4 | 44 | 0.45 | 29% | 1.6 |
| Example 5 | 59 | 0.40 | 35% | 1.8 |

Dose to print:=energy required in millijoules (mj) per square centimeter (cm²) where the measured photoresist feature size matches the corresponding reticle feature size at the best focus.

Resolution:=smallest feature size in microns (μm) opened with an acceptable pattern profile (pattern edge acuity>80°)

Depth of focus:=the extend of defocus (microns) of the optical exposure system where the resist is able to maintain an acceptable pattern profile and within±10% of the critical dimension (CD).

Exposure Latitude:=percentage range of the exposure dose tolerated by the resist to print the pattern of a given feature size within±10% of its Critical Dimension.

Other Test Procedures:
1) Solution Viscosity-Relative Molecular Weight (RMW):

The viscosity solution was prepared by dissolving 7 grams of novolak resin in a 100 ml. volumetric flask, using cyclohexanone solvent. The solution was filtered using a 5 micron pressure syringe filter. The viscosity was measured using a Cannon-fenske® #200 viscometer at 25°C. The relative molecular weight (RMW) was determined using the following equation:

$$M\,\mathrm{rel} = \left[ 1/C \log\left(\frac{n}{no}\right) \right]^2$$

where c=concentration of resin in g/ml.
n=viscosity of resin in cyclohexanone
$n_0$=viscosity of cyclohexanone 2) Dissolution Rate Measurement:

Formulations:
Dissolve 26% resin solids in PGMEA. Filter through a 0.2 μm disposable Acrodisc filter.

Reference Standards:
S-Resin Novolak resin Stock #D9922A produced by Hoechst Celanese Corporation (supplied in PGMEA solvent).

Dissolution Rate Measurement Procedure:
1. Each sample was coated on a 4 inch silicon wafer, at the appropriate speed, on an SVG coat-development track system, then baked on a hot plate for 60 seconds at 90° C., to obtain a 1.29 μm film.
2. The film thickness was determined on an Autonanospec® (NANOMETRICS, model 215), automated film thickness measurement system, measuring 10 points across the entire wafer.

3. The Dissolution Rate was determined by measuring the film thickness change with time using a laser end-point detection system consists of a He-Ne laser (634 nm, 3 mW, ORIEL CORP., Model 79202) and a photodiode. The development was performed at 23° C. using AZ®300 MIF TMAH developer and the dissolution rate was calculated by the equation $$\Delta t = \lambda/2n$$

where $\lambda$ is the wavelength of the laser, n is the index of reflection of the film material at that wavelength and $\Delta t$ is the change in thickness that occurs in the time span between maxima (or minima) interference of the film during the dissolution process.

Molecular Weight Data (Mw and Mn):

The molecular weight of the polymers, whether weight average molecular weight Mw, or number average molecular weight Mn, were measured by gel permeation chromatography (GPC) performed on dilute solutions of the polymer in tetrahydrofuran (THF). The actual apparatus employed consisted of a Waters (Millipore Corp.) programmable automatic sampler, vacuum pump, chromatography columns with heater, and a differential refractometer connected to a Shimadzu® CR 30A data reduction system with accompanying software (version 1.1, Shimadzu part No. T/N 22301309-91). The refractometer used was a Waters model 410 and four chromatography columns, 500 Angstrom, 1000 Angstrom, 10,000 Angstrom and 100,000 Angstrom (available from Waters) were connected in series. The system was calibrated using multiple available polystyrene standards ranging in molecular weight as follows:

| GPC CALIBRATION | |
| --- | --- |
| Calibration Standard (Polystyrene) | Mol. Wt. |
| 1 | 470,000 |
| 2 | 170,000 |
| 3 | 68,000 |
| 4 | 34,500 |
| 5 | 9,200 |
| 6 | 3,200 |
| 7 | 1,250 |

The standards are essentially monodisperse, consisting substantially of a single molecular weight. With the system thus calibrated the weight average molecular weight (Mw), the number average molecular weight (Mn), and polydispersity (Mw/Mn), were obtained for polymers produced in accordance with the Examples.

The above table shows the results of scanning electron microscope (SEM) analysis of the five examples. Example 1, which is the pure trishydroxyphenylethane (THPE) photoactive compound (PAC), has the highest dose requirement, along with the maximum resolution. With the replacement of a portion of the THPE PAC with the trishydroxybenzophenone (THBP) PAC, Examples 3 through 5, 5 being the optimum, we see only a small decrease in resolution, but more importantly their is about a 60% dose decrease. Example 5 also shows no decrease in exposure latitude when comparing it to Example 1. Example 2, which is pure THBP PAC, has very low dose requirement, but poor resolution and depth of focus. The dose requirements for Example 2 would make this photoresist impractical for use in the industry because exposure tools are not accurate and reproducible in this low dose region. Example 1 has a large dose requirement, which severely impacts manufacturing throughput.

Example 5 has the benefit of low dose requirement while being in a usable dose range for exposure tools, as well as good resolution, exposure latitude, and depth of focus.

What is claimed is:

1. A positive photoresist composition which comprises an admixture of:
    (a) a photosensitizer comprising an admixture of from about 25% by weight to about 85% by weight of a trishydroxyphenylethane 80/20 to 50/50 2,1,5-2,1,4-diazonaphthoquinone sulfonate, and from about 15% by weight to about 75% by weight of a trihydroxybenzophenone 0/100 to 20/80 2,1,5-/2,1,4-diazonaphthoquinone sulfonate, the photosensitizer being present in the photoresist composition in an amount sufficient to uniformly photosensitize the photoresist composition; and
    (b) a water insoluble, aqueous alkali soluble novolak resin, the novolak resin being present in the photoresist composition in an amount sufficient to form a substantially uniform photoresist composition.

2. The composition of claim 1 further comprising one or more solvents.

3. The composition of claim 2 wherein said solvent comprises propylene glycol monomethyl ether acetate.

4. The composition of claim 1 wherein (a) is present in an amount of from about 1 to about 35 weight percent and (b) is present in an amount from about 65 to about 95 weight percent, based on the non-solvent components of the composition.

5. The composition of claim 1 wherein said photosensitizer comprises a trishydroxyphenylethane 60/40 to 70/30 2,1,5-/2,1,4-diazonaphthoquinone sulfonate.

6. The composition of claim 1 further comprising one or more additives selected from the group consisting of colorants, leveling agents, anti-striation agents, plasticizers, adhesion promoters, speed enhancers and surfactants.

7. A photosensitive element comprising a substrate and the dried composition of claim 1 coated on said substrate.

8. The element of claim 7 wherein the substrate is selected from the group consisting of silicon, aluminum, polymeric resins, silicon dioxide doped silicon dioxide, gallium arsenide, Group III/V compounds, silicon nitride, tantalum, copper, polysilicon, ceramics and aluminum/copper mixtures.

9. The element of claim 7 wherein the substrate has an adhesion promoted surface.

10. The element of claim 7 wherein the composition further comprises one or more components selected from the group consisting of non-aromatic colorants, dyes, anti-striation agents, leveling agents, plasticizers, adhesion promoters, speed enhancers and surfactants.

11. The element of claim 7 wherein (a) is present in an amount of from about 1 to 35 weight percent and (b) is present in an amount from about 65 to 99 weight percent, based on the non-solvent components of the composition.

12. A photosensitizer comprising an admixture of from about 25% by weight to about 85% by weight of a trishydroxyphenylethane 80/20 to 50/50 2,1,5-/2,1,4-diazonaphthoquinone sulfonate, and from about 15% by weight to about 75% by weight of a trihydroxybenzophenone 0/100 to 20/80 2,1,5-/2,1,4-diazonaphthoquinone sulfate.

13. The photosensitizer of claim 12 comprising a trishydroxyphenylethane 60/40 to 70/30 2,1,5-/2,1,4-diazonaphthoquione sulfonate.

\* \* \* \* \*